United States Patent
Xiao et al.

(10) Patent No.: US 9,697,321 B2
(45) Date of Patent: Jul. 4, 2017

(54) METHOD OF IDENTIFYING A VALUE OF AN UNKNOWN CIRCUIT COMPONENT IN AN ANALOG CIRCUIT

(71) Applicant: Hitachi, Ltd, Tokyo (JP)

(72) Inventors: Yuan Xiao, Farmington Hills, MI (US); Donald J. McCune, Farmington Hills, MI (US); Can Wang, Farmington Hills, MI (US); Heming Chen, Novi, MI (US); Sujit Phatak, Farmington Hills, MI (US); Yasuhiro Ito, Novi, MI (US)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 14/311,809

(22) Filed: Jun. 23, 2014

(65) Prior Publication Data

US 2015/0370956 A1 Dec. 24, 2015

(51) Int. Cl.
*G06F 17/50* (2006.01)

(52) U.S. Cl.
CPC ...... *G06F 17/5081* (2013.01); *G06F 17/5036* (2013.01); *Y02T 10/82* (2013.01)

(58) Field of Classification Search
CPC .................................................. G06F 17/5081
USPC ........................................................ 716/107
See application file for complete search history.

(56) References Cited

U.S. PATENT DOCUMENTS

2012/0290282 A1* 11/2012 Case et al. ...................... 703/15
2014/0184319 A1* 7/2014 De Geronimo et al. ..... 327/552

* cited by examiner

*Primary Examiner* — Vuthe Siek
(74) *Attorney, Agent, or Firm* — Mattingly & Malur, PC

(57) ABSTRACT

A method for identifying a value of an unknown circuit component for an analog signal having a known output profile in which a simulation list of the analog circuit is first created including the component with the unknown value. A transfer function for the known output value is then created using a programmed processor and the transfer function is then solved by the processor for the value of the unknown component. For nonlinear circuit components, a linear model is substituted for the nonlinear components prior to creating the simulation list.

20 Claims, 4 Drawing Sheets

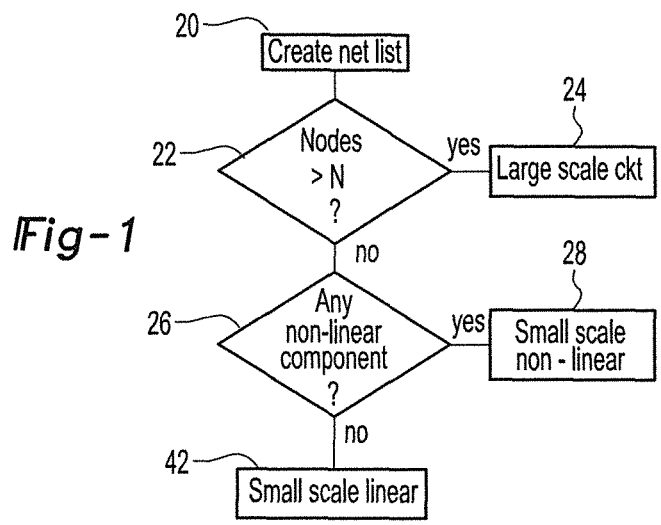
*Fig-1*
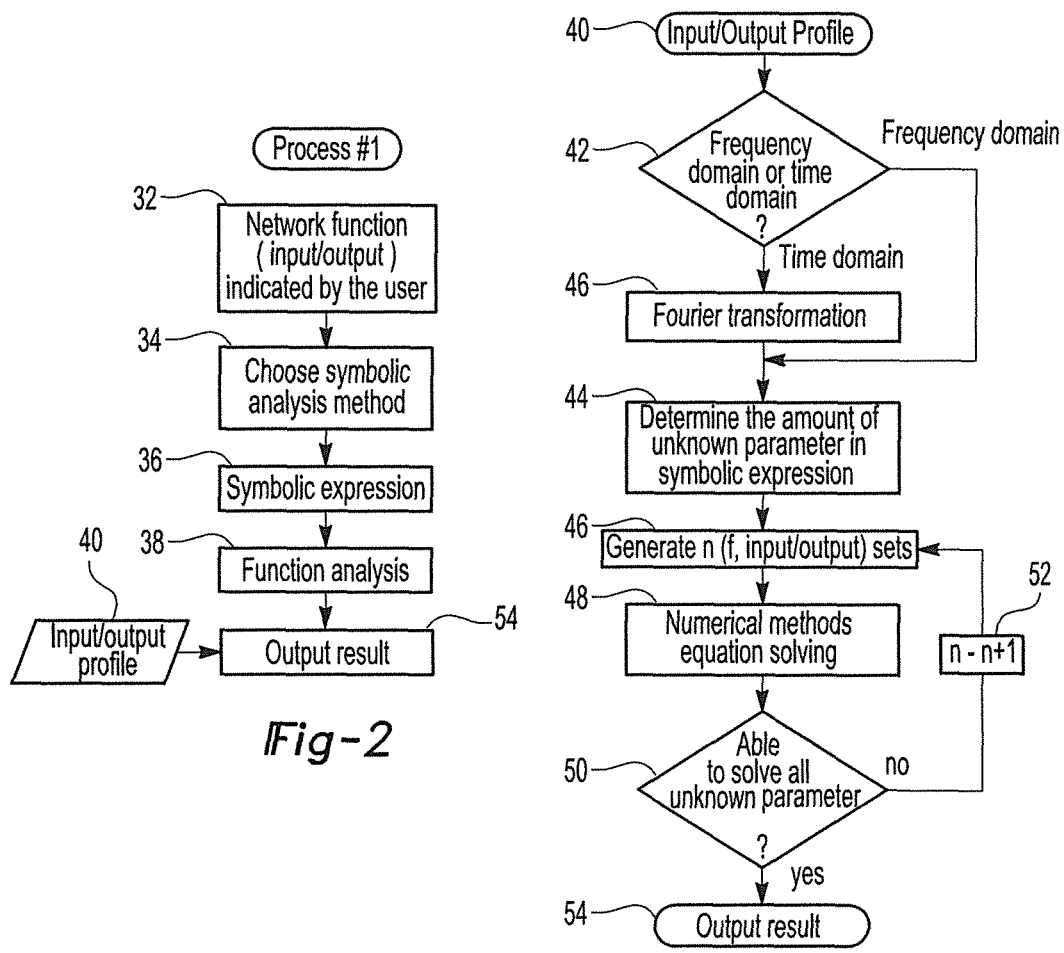
*Fig-2*
*Fig-3*

METHOD OF IDENTIFYING A VALUE OF AN UNKNOWN CIRCUIT COMPONENT IN AN ANALOG CIRCUIT

BACKGROUND OF THE INVENTION

I. Field of the Invention

The present invention relates to a method for identifying the value of an unknown circuit parameter in an analog circuit having a known input/output profile.

II. Description of Related Art

The design of complex electronic systems, such as the electronic systems utilized to control the operation of a modern automotive vehicle, is a prolonged process oftentimes involving tens and even hundreds of analog circuits. Furthermore, the design of such complex systems is oftentimes initiated years prior to the actual implementation of the system in production.

In many cases, the overall design of the system must be thoroughly tested before the system can be put into production. This is particularly true for systems, such as an automotive control system, in which malfunction of the systems can create a safety hazard.

In order to thoroughly test the electronic system during its design, a mathematical model of the system is often created to enable a computer simulation of the system without the necessity of actually constructing the system. For example, SPICE is one well known computer program which performs electronic simulation of analog electronic circuits.

In order to perform a simulation of the system using a simulator, such as SPICE, it is necessary to input the various circuit components and the interconnection of those components, but also the value of the individual components. After the value of the electronic components, as well as their interconnection, are input into the simulation program, the simulation program is able to generate the input/output profile of the circuit.

In some cases, however, the chip supplier and/or circuit supplier will not provide detailed information regarding circuit parameters used in the circuit. Instead, these suppliers provide only an input/output profile for the circuit or the input/output profile can be gained via testing.

When the values of the individual components within the electronic circuit are unknown, simulation of the electronic circuit on an electronic simulator, such as SPICE, is lack of fidelity or impossible. Consequently, in such cases the overall design of the electronic system is delayed or otherwise compromised.

SUMMARY OF THE PRESENT INVENTION

The present invention provides a method for automatically identifying unknown circuit parameter in analog circuits which match the input/output profiles specified by the circuit or integrated circuit supplier.

In brief, the circuit is first inputted into a circuit simulator, such as SPICE. In the well-known fashion, the simulator outputs a wrong message which will identify the circuit component with the unknown value and circuit netlist file will also be generated with unknown circuit parameter. .

After first step, the designed method/simulator will examine to see if it is a (1) small scale linear circuit, (2) small scale nonlinear circuit, or (3) large scale linear and nonlinear circuit. Each different type of circuit is then processed in a different fashion.

After the circuit has been inputted into the simulator, the processor (the designed processor), under program control, generates a Laplace transfer function. The transfer function is then simplified at different frequency so that the transfer functions contain the known values or parameters for the circuit components as well as the circuit component with the unknown value are adequate to generate the unknown value. The processor then solves the equation to obtain the value of the unknown parameter.

Conversely, in the event that the circuit contains nonlinear components, e.g. diodes, transistors, etc., a mathematical/circuit model containing only linear components is substituted for the nonlinear component as the system is inputted into the circuit simulator. Thereafter, the transfer function is first determined and then solved for the unknown circuit component in the previously described fashion.

In the event that the circuit is a large scale circuit, e.g. more than ten interconnection nodes, the transfer function for the overall circuit becomes overly complex so that solution of the Laplace transform will become complicated. Consequently, for large scale circuits, the overall circuit is first partitioned into smaller interconnected sub-circuits by network partitioning using the hierarchical decomposition method. A terminal block analysis is then used to analyze the electrical behavior of the circuit after that partitioning which is represented by an n-terminal block.

Modified Nodal Analysis Method is then used on the partition blocks which generates a system of equations. These equations, known as Reduced Modified Nodal Analysis equations, are then solved by suppressing all internal variables. This results in a simplified matrix for the 3-terminal blocks.

Middle block analysis is then performed successfully in a hierarchal binary fashion by traversing the partitioning binary tree upwards to its root. The final result is then one RMNA matrix which characterizes the entire network in terms of the defined input and output values. After the entire tree has been analyzed, the final result is one RMNA matrix which characterizes the entire network in terms of the defined input and output variables specified by the user.

Alternatively, a database containing analog circuits may be searched using pattern recognition to identify the same or similar circuit in the database.

BRIEF DESCRIPTION OF THE DRAWING

A better understanding of the present invention will be had upon reference to the following detailed description when read in conjunction with the accompanying drawing, wherein like reference characters refer to like parts throughout the several views, and in which:

FIG. 1 is a flowchart illustrating the method of selection between the linear and nonlinear circuits and large and small scale circuits;

FIG. 2 is a flowchart illustrating the overall method with a small scale linear circuit;

FIG. 3 is a flowchart illustrating the function analysis process for the small scale linear circuit;

Figure 4:
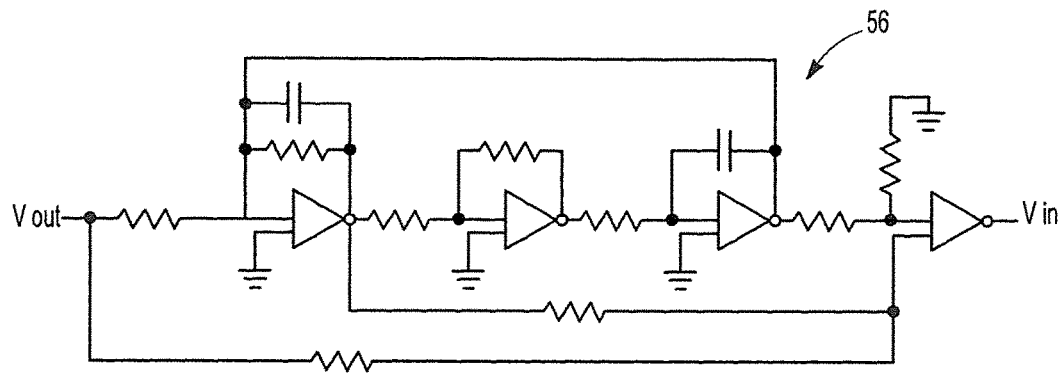
FIG. 4 is an exemplary small scale linear circuit.

DETAILED DESCRIPTION OF A PREFERRED
EMBODIMENT OF THE PRESENT INVENTION

With reference first to FIG. 1, in order to analyze the circuit and determine the values of its components, a netlist or other input representing the circuit is first created by circuit simulator at step 20. This netlist contains all of the components of the circuit, including the component with the unknown value, as well as the interconnection between the components. These interconnections are represented by nodes within the circuit with each node connecting two or more circuit components together. After the data or netlist representative of the circuit is inputted at step 20, step 20 proceeds to step 22.

At step 22, the number of nodes in the netlist are counted and compared to a threshold value N, e.g. 10. If the number of nodes exceeds 10, step 22 branches to step 24 which identifies the circuit as a large scale linear or nonlinear circuit. Conversely, if the number of nodes in the netlist is less than N, step 22 branches instead to step 26.

At step 26, the programmed processor determines if there are any nonlinear components within the circuit. If so, step 26 branches to step 28 which identifies the circuit as a small scale circuit with nonlinear components. Otherwise, step 26 branches to step 30 which identifies the circuit as a small scale linear circuit.

Regardless of whether the overall circuit is a large scale or small scale circuit, or a circuit containing only linear components or nonlinear components, the input/output profile of the circuit is known from the data sheet from the supplier or testing. Consequently, even though the actual value of one or more components from the circuit may be unknown, the input/output profile is known.

Assuming that the circuit was first identified as a small scale linear circuit at step 30, the circuit contains only linear components such as resistors, capacitors, inductors, current and voltage controlled current and voltage sources, and ideal operational amplifiers.

With reference now to FIG. 2, to fully analyze the small scale linear circuit, the input/output pin/node is first indicated by the user at step 32. Step 32 then proceeds to step 34.

At step 34, the analysis method for the circuit is selected. This analysis may be either an algebraic (matrix or determinant based) method in which the behavior of the linear circuit is described by a set of equations with symbolic coefficients. Alternatively, a graph-based method in which the behavior of the linear circuit is represented by a graph with symbolic branch weights may be used and selected at step 34. In either case, the symbolic expression of the circuit with designated input/output, either algebraically or graphically, is outputted at step 36. Step 36 proceeds to a function analysis at step 38. The input/output profile at step 40 is also provided as an input to the function analysis at step 38.

With reference now to FIG. 3, a flowchart illustrating the function analysis 38 (FIG. 2) is shown. Step 40 provides the input/output profile and then proceeds to step 42 which determines if the input/output profile is in either the frequency domain or the time domain. However, since the circuit is a linear circuit, it does not matter whether the input/output profile is in the time domain or frequency domain since the unknown circuit parameter will always be solved by a Laplace transformation and then the solution of the Laplace function for the known input/output profile.

Consequently, if the input/output profile is in the frequency domain, step 42 proceeds to step 44. Otherwise, step 42 proceeds to step 46 which converts the time domain input/output profile to the frequency domain and step 46 then proceeds to step 44.

At step 44 the number n of unknown parameters in the Laplace transformation is first determined. Step 44 then proceeds to step 46.

At step 46, the programmed processor generates n sets of data with each set containing transfer function at different frequency of the circuit. Step 46 then proceeds to step 48.

At step 48, numerical methods and equation solving techniques are performed on each set of data by the programmed processor. Step 48 then proceeds to step 50.

At step 50 it is determined whether or not all of the unknown parameters n have been solved. If not, step 50 proceeds to step 52 which increments n and then back to step 46. In this fashion, n data sets are generated and solved for the circuit. When all n unknown parameters have been solved, step 50 proceeds to step 54 and outputs the result.

For example and with reference to FIG. 4, an active RC filter circuit 56 is shown. The circuit 56 contains only linear analog circuits and has less than N nodes. As such, it is properly classified as a small scale linear circuit with a resistor Rx with an unknown value.

After inputting the netlist into the simulator at step 32, an algebraic analysis is selected at step 34. In doing so, a Laplace transfer function H(s) of the RC filter circuit 56 is generated as follows:

$$H(s) = \frac{-G_4 G_8 G_9 (G_1 G_2 + G_1 G_3 + G_1^2 + G_2 G_6) + sG_7 G_9 C_2 (G_1 G_3 - G_2 G_5) - s^2 C_1 C_2 G_2 G_7 G_9}{G_1 G_9 (G_4 G_6 G_8 + sG_5 G_7 C_2 + s^2 G_7 C_1 C_2)}$$

where $G_X$ is the conductance corresponding to resistance $R_X$.

In order to simplify the solution, assume that the frequency or s equals 0 so that the transfer function above is simplified as follows and set to the input/output profile $V_{out}/V_{in}$:

$$H(0) = \frac{-(G_1 G_2 + G_1 G_3 + G_1^2 + G_2 G_6)}{G_1 G_6} = \frac{V_{out}}{V_{in}}.$$

Step 48 (FIG. 3) then solves the simplified transfer function H(0) for the unknown resistor Rx. Since in this example only a single resistor value is unknown, step 50 (FIG. 3) then branches directly to 54. However, if additional circuit components have an unknown value, step 50 will instead branch back to step 46 and solve the transfer function for the other unknown circuit components.

Figure 5:
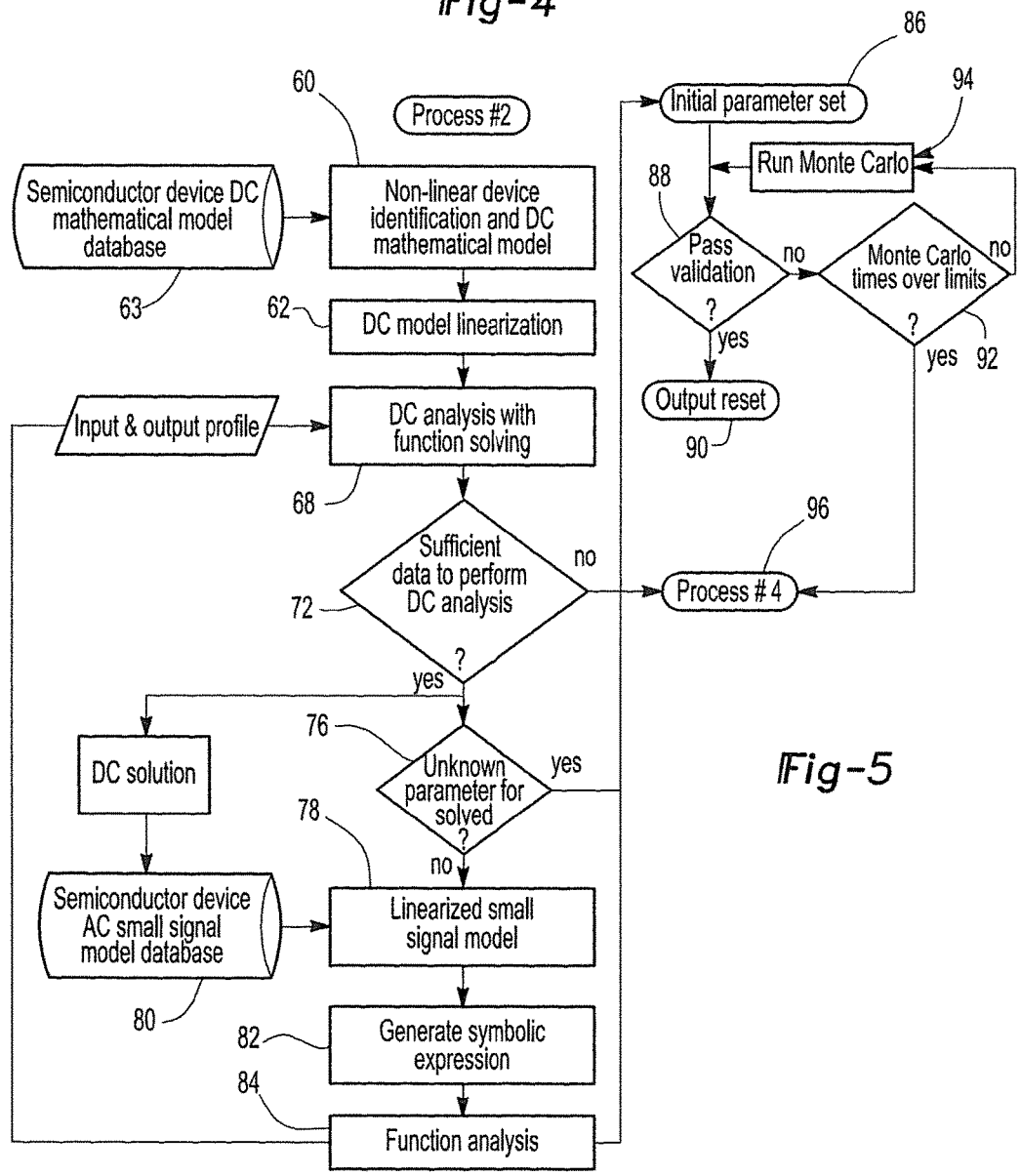
FIG. 5 is a flowchart illustrating the process for a small scale nonlinear circuit.

With reference again to FIG. 1, assuming that the circuit under analysis contains fewer than N nodes, but contains one or more nonlinear components, step 26 instead branches to step 28 to perform the small scale nonlinear analysis of the circuit. A flowchart illustrating the nonlinear analysis is shown in FIG. 5.

In order to perform the analysis with nonlinear components, mathematical models of the nonlinear components are substituted prior to generating a Laplace transformation or function for the circuit. Consequently, at step 60 all nonlinear devices in the circuit are identified and replaced with a DC mathematical/circuit model. Such a DC mathematical model is retrieved from a database 62 accessible to the programmed processor.

For example, a DC mathematical model of a diode may be expressed as follows:

$$i_D = I_S(\exp^{\frac{v_D}{NV_t}} - 1).$$

Similarly, a bipolar junction transistor may be modeled as follows:

$$i_c = I_s\left(e^{\frac{v_{BE}}{V_T}}\right)$$

while a unipolar transistor model may be modeled as follows:

$$i_D = \frac{KP}{2}\frac{W}{L}(v_{GS} - V_{th})^2.$$

Other models for other nonlinear components are also available to the program from the database 62 and the above three models are exemplary only. Once the proper model has been obtained at step 60, step 60 proceeds to step 62.

Figure 6:
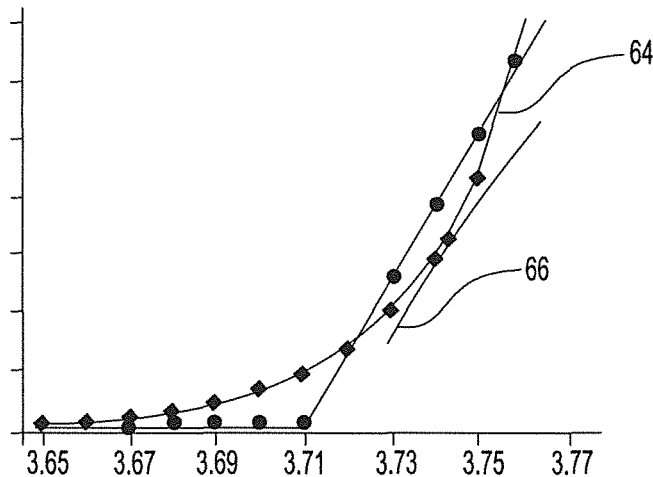
FIG. 6 is a graph illustrating a DC model linearization of a nonlinear circuit component (diode as an example)
Figure 7:
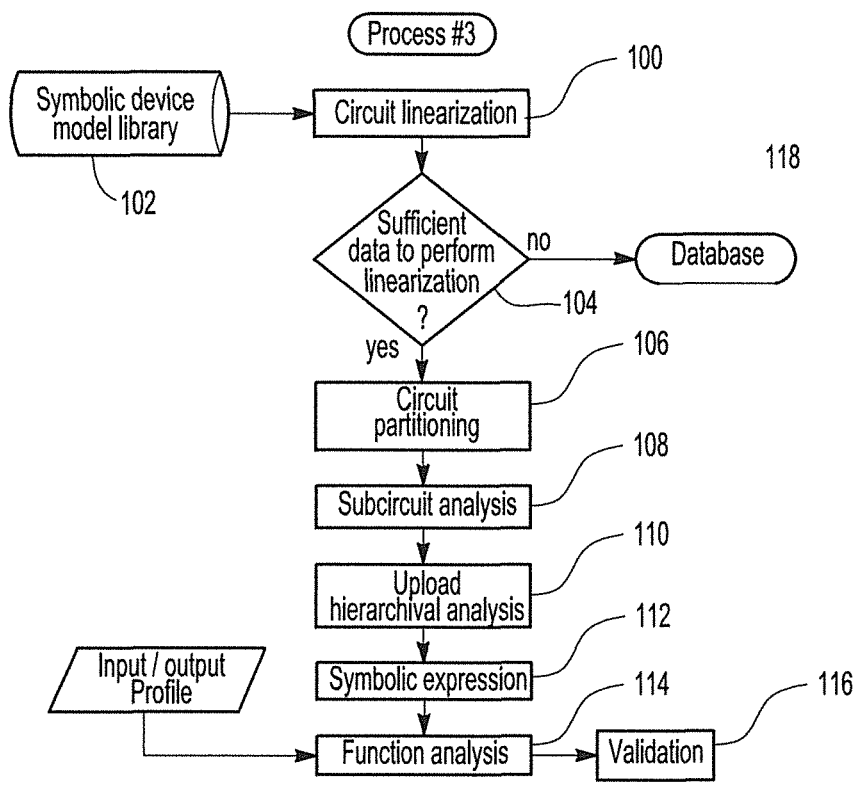
FIG. 7 is a flowchart illustrating the process for a large scale linear or nonlinear circuit.

At step 62, the programmed processor provides a DC model linearization to at least a portion of the operating range of the nonlinear circuit component. For example, as shown in FIG. 6, the actual operating characteristics of the nonlinear circuit component are shown by graph 64. Step 62, however, substitutes a DC linear graph 66 to simulate the operation of the nonlinear component in a linear manner. Such linearization may be done, for example, according to Taylor expansion.

Following the DC model linearization at step 62, step 62 proceeds to step 68 which performs a DC analysis with function solving on the model. Step 68 also receives the input/output profile from step 70 and then proceeds to step 72.

At step 72, the programmed processor determines that there is sufficient data to perform the DC analysis. If so, step 72 proceeds to step 76 where it is determined if all of the unknown parameters are solved. If not, step 76 proceeds to step 78.

At step 78, the DC solution for a small signal model for the nonlinear circuit components is retrieved from a database 80. For example, semiconductor devices are handled as sub-circuits using linear small signal models built around an initial DC solution to the circuit. Since the DC solution for each semiconductor device has already been determined at step 68, nonlinearized netlist components will be replaced with linearized netlist files at step 78. Step 78 then proceeds to step 82 which generates the symbolic expression or Laplace transfer function which is then solved using function analysis at step 84. The generation of the transfer function at step 82 has already been described with respect to step 36 in FIG. 2 and the function analysis step 84 corresponds to the function analysis step 38 and FIG. 3, which description is incorporated by reference.

Still referring to FIG. 5, if the unknown parameters are solved by step 76 or through the function analysis at step 84, it is still desirable to validate the overall results for high fidelity purpose. Consequently, both steps 76 and 84 branch to step 86 which sets an initial parameter set for the validation test. Step 86 then proceeds to step 88.

At step 88, using the initial parameter set by step 86, computes the input/output profile of the current simulated circuit. If the computed input/output profile matches the actual input/output profile, or is within an acceptable error amount of the actual input/output profile, step 88 proceeds to step 90 and outputs the result that the simulation has passed validation. Otherwise, step 88 proceeds to step 92.

At step 92, the program determines if the adjustment or variation of the value of the circuit component exceeds a preset time limit. If so, step 92 exits to step 94. However, if within time limits, step 92 instead exits to step 94 in which the value of the unknown component is varied by a predetermined amount set by the program. Step 94 then proceeds back to step 88 where the validation process is repeated until either the validation process shows that the simulated circuit is within an acceptable error of the actual input/output profile, or has exceeded the time limit set at step 92.

With reference again to FIG. 1, in the event that the circuit contains over N nodes, e.g. over ten nodes, step 22 branches to step 24 to perform large scale analysis. In such an analysis, it is mathematically difficult, if not impossible, to simply state the transfer function as a single expression due to the complexity of the circuit. Instead, the circuit is reduced to a succession of smaller expressions, each expression representing a portion of the circuit, with a backward hierarchical dependency on each other.

More specifically and with reference to FIG. 6, at step 100, all nonlinear components are replaced with linear models obtained, for example, from a database 102. The substitution of linear models for nonlinear components has already been described in detail and is incorporated by reference. Step 100 then proceeds to step 104. At step 104, the programmed processor determines if there is sufficient data to perform linearization. If so, step 104 proceeds to step 106. At step 106, the entire circuit network is partitioned using hierarchical decomposition methods. Such partitioning process continues until only one node exists in each terminal block.

Following the circuit partition at step 106, step 106 branches to step 108 where each sub-circuit formed by the partitioning is subjected to analysis. Preferably, terminal block analysis is used to analyze the electrical behavior of the circuit so that each partition is represented by an n-terminal block. A symbolic system of equations must be extracted from the sub-circuit in order to find the symbolic solution for the network variables.

Preferably, Modified Nodal Analysis Method (MNA) is used to initially find the system of equations. One advantage of using MNA is that it allows branch currents as network variables in the analysis which enables the ability to include voltage sources in all four types of controlled power sources.

A Laplace transform representation of the admittance value of the circuit elements is used in the formulation of its equations.

The system of equations is therefore written as:

$$\begin{bmatrix} Y_n & B \\ C & D \end{bmatrix}\begin{bmatrix} V \\ I \end{bmatrix} = \begin{bmatrix} J \\ E \end{bmatrix}$$

where V is the node-to-datum voltages; I is the branch current variables; $Y_n$ is the modified nodal admittance matrix; B, C, and D are the contributions of the branch relationship equations; J represents the current sources in the network; and E represents the independent voltage sources.

The next step in the sub-circuit analysis at step 108 is to suppress all internal variables so that each sub-circuit is written in terms only of the external variables. This results in a huge reduction in the size of the matrices and the elimination of information neither needed nor requested by the circuit analysis. The suppression of the internal variables is known as a Reduced Modified Nodal Analysis equation. Both Gaussian elimination and Schur complement are used to reduce the matrices and generate the final transfer function for each sub-circuit.

After the analysis on each sub-circuit has been completed at step 108, step 108 proceeds to step 110 which performs an upward hierarchal analysis of the overall circuit. This is accomplished by successfully performing the middle block analysis in a hierarchal binary fashion by traversing a binary tree upward starting with the leaves until the root of the tree is reached. Such a middle block analysis is well known in the art so that a further description hereof is unnecessary.

The final result of the upward hierarchical analysis performed by step 110 is an RMNA matrix which characterizes the entire network in teens of the defined input and output values. Step 110 then proceeds to step 112 where the Laplace transfer function is solved from the RMNA matrix in the previously described fashion. Likewise, step 112 proceeds to step 114 where a function analysis is performed. This function analysis corresponds to step 38 in FIG. 2 and has already been described in detail. That description is incorporated by reference. Step 114 then proceeds to step 116 where a validation procedure is performed on the circuit simulation. That validation has already been described in detail and illustrated in FIG. 5 and will not be repeated.

Still referring to FIG. 6, in the event that there is insufficient data to perform the linearization, step 104 will instead branch to step 118. At step 118, a database will be searched for similar or identical circuits using any of the known search techniques, such as comparison of the netlist, pattern searching, and the like.

Figures 8, 9:
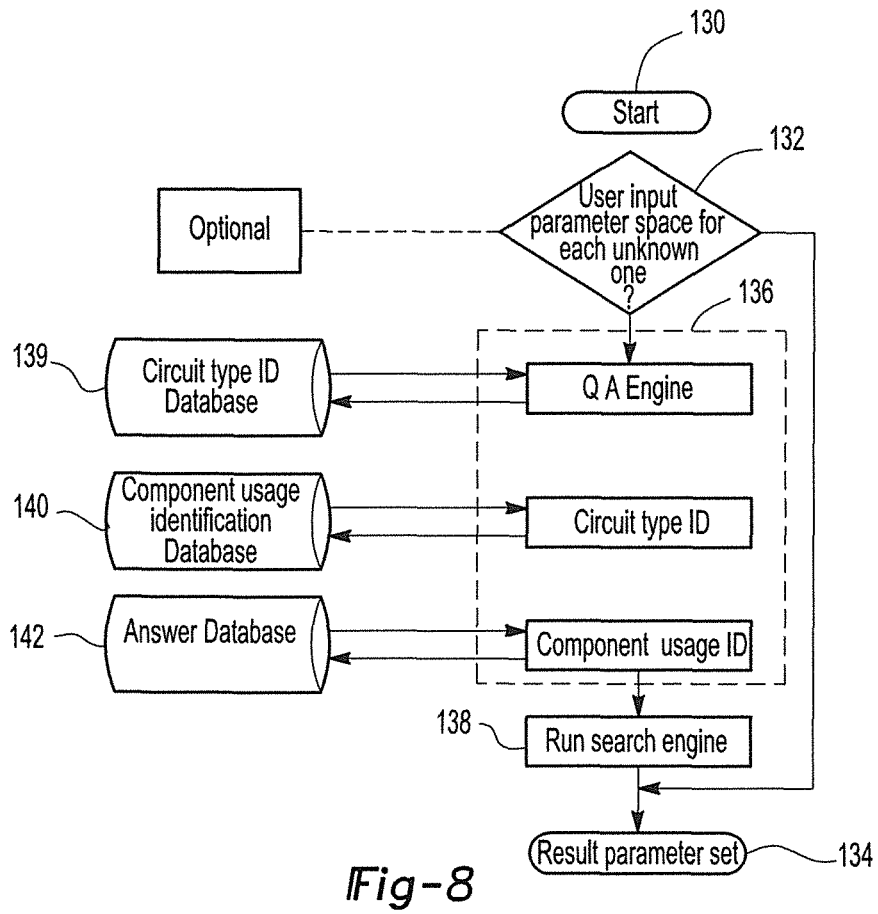
FIG. 8 is a flowchart illustrating a database search.
FIG. 9 is a view illustrating an answer database format.

An exemplary database search is shown in FIG. 8 where the database search begins at step 130. Step 130 then proceeds to step 132 where the user inputs the parameter space of each unknown parameter in the circuit. If the parameter space is known, step 132 branches to step 134 where the result parameter set is established.

However, if the user does not input all of the parameter space, step 132 instead proceeds to step 136 in which a search engine queries three separate databases in order to generate the parameter space. These three databases include a circuit type identification database 138, a component usage identification database 140, as well as an answer database 142.

First, the search engine 136 will acquire data from the circuit type identification database 139 as well as the component usage identification database 140 according to the component ID. An exemplary partial component ID is shown in FIG. 9.

Secondly, the netlist comparison part will do three things. First, it will receive data from data acquiring part and then compare the input netlist file and the netlist file of certain circuit types stored in the two databases 139 and 140 and generate an approximate ratio. A search engine 136 will then select the circuit with the highest approximation ratio and output the comparison result, i.e. the circuit ID type, next to the part.

Finally, the answer database 142 will be queried using the two IDs, namely the circuit type and component usage IDs, to select the closest circuit corresponding to the two IDs in the answer database 142.

Next, a value must be assigned to the identified component in the circuit. The initial value assigned will depend, if known, on the type of circuit. For example, as shown in FIG. 19, if a resistor is identified as the proper component and is used in a current/voltage sensor, the resistor value will be relatively low. Conversely, if the resistor is used as a voltage divider, the initial resistor value will be set relatively high. However, if the question/answer database 142 cannot determine the type of circuit, it will automatically provide a default value based upon the type of component. This default value will be a mid value within the parameter space as the starting parameter set.

Lastly, the circuit simulator is initiated and the simulation is conducted based on derivative free search algorithm until the simulation result matches the input/output profile within an acceptable error range.

There are four types of often used derivative free optimization methods, namely general algorithm, simulated annealing, random search, and downhill simplex search. Any of these may be used to search the question/answer database. Other methods, however, may also be used.

For example, for a random search a start parameter set is selected as a current point and the simulation program is executed to generate the current output as f(x).

A random vector (dx1, dx2, dx3 . . . ) is then added to the current point (x1, x2, x3) in the parameter space and the simulation program is again executed with the new parameter set (x1+dx1, x2+dx2, x3+dx3 . . . ). This simulation will then generate the output as f(x+dx).

Next, the two outputs, namely f(x) and f(x+dx), are then compared with the input/output profile for the circuit under test. If f(x+dx) is closer to the desired output profile, the current parameter set is changed from (x1, x2, x3 . . . ) to (x1+dx1, x2+dx2, x3+dx3 . . . ). If the simulation result matches the output profile of the circuit within an acceptable error range, the random search is terminated with the current parameter set. Otherwise, the random search is simply repeated with new random vectors until the simulation generates an acceptable output profile.

From the foregoing, it can be seen that the present invention provides a unique method for analyzing circuits having components with unknown values. Having described our invention, however, many modifications thereto will become apparent to those skilled in the art to which it pertains without deviation from the spirit of the invention as defined by the scope of the appended claims.

We claim:

1. A method for creating a simulation file for simulating an analog circuit having an unknown circuit parameter, the method comprising:
   receiving, by a processor, as inputs to a circuit simulation program executed by the processor, values of individual components of an analog circuit and respective interconnections of the individual components, for creating the simulation file of the analog circuit, wherein the respective interconnections are represented by nodes within the simulation file, wherein a first value of a first component of the individual components is an unknown circuit parameter of the analog circuit;
   determining, by the processor, based at least partially on component types of the individual components, that a second component of the individual components is a nonlinear component;

obtaining, by the processor, from a database of mathematical models for nonlinear components, a direct current (DC) mathematical model corresponding to the component type of the second component;

determining, by the processor, a linear function for the second component for at least a portion of an operating range of the second component to substitute for the second component in the simulation file;

generating, by the processor, a transfer function from the simulation file for one or more nodes of the simulation file;

determining, by the processor, the first value for the first component from the transfer function using a known input/output profile for the analog circuit;

executing, by the processor, the simulation file using the determined first value to simulate operation of the analog circuit for determining a simulated output profile; and based at least partially on determining that a difference between the simulated output profile and the known input/output profile is less than a threshold error amount, outputting, by the processor, a result indicating that the created simulation file has passed validation.

2. The method as defined in claim 1 wherein the transfer function comprises a Laplace transfer function.

3. The method as defined in claim 1 wherein the simulated output profile is in the time domain.

4. The method as defined in claim 1 wherein the simulated output profile is in the frequency domain.

5. The method as defined in claim 1 further comprising
adjusting an initially determined value for the first value based on the difference being initially greater than the threshold error amount; and
repeating execution of the simulation file using the adjusted first value.

6. The method as defined in claim 5, further comprising recursively repeating adjustment of the first value and execution of the simulation file until the difference is less than the threshold error amount.

7. A method for creating a simulation file for simulating an analog circuit having an unknown circuit parameter, the method comprising:

receiving, by a processor, as inputs to a circuit simulation program executed by the processor, values of individual components of an analog circuit and respective interconnections of the individual components, for creating the simulation file of the analog circuit, wherein the respective interconnections are represented by nodes within the simulation file, wherein a first value of a first component of the individual components is the unknown circuit parameter of the analog circuit;

generating, by the processor, a transfer function from the simulation file for one or more nodes of the simulation file;

determining, by the processor, the first value for the first component from the transfer function using a known input/output profile for the analog circuit;

executing, by the processor, the simulation file using the determined first value to simulate operation of the analog circuit for determining a simulated output profile;

adjusting, by the processor, an initially determined value for the first value based on the difference being initially greater than the threshold error amount;

repeating, by the processor, execution of the simulation file using the adjusted first value; and based at least partially on determining that a difference between the simulated output profile and the known input/output profile is less than a threshold error amount, outputting, by the processor, a result indicating that the created simulation file has passed validation.

8. The method as defined in claim 7 where the transfer function comprises a Laplace transfer function.

9. The method as defined in claim 7 wherein the simulated output profile is in the time domain.

10. The method as defined in claim 7 wherein the simulated output profile is in the frequency domain.

11. The method as defined in claim 7, further comprising substituting, in the simulation file, for a nonlinear component of the analog circuit, a linearized model of the nonlinear component.

12. A method comprising:

receiving, by a processor, as inputs to a circuit simulation program executed by the processor, values of individual components of an analog circuit and respective interconnections of the individual components, for creating a simulation file of the analog circuit, wherein the respective interconnections are represented by nodes within the simulation file, wherein a first value of a first component of the individual components is an unknown circuit parameter of the analog circuit;

generating, by the processor, a transfer function from the simulation file for one or more nodes of the simulation file;

determining, by the processor, the first value for the first component from the transfer function using a known input/output profile for the analog circuit;

executing, by the processor, the simulation file using the determined first value to simulate operation of the analog circuit for determining a simulated output profile; and based at least partially on determining that a difference between the simulated output profile and the known input/output profile is less than a threshold error amount, outputting, by the processor, a result indicating that the created simulation file has passed validation.

13. The method as defined in claim 12 where the transfer function comprises a Laplace transfer function.

14. The method as defined in claim 12 further comprising
adjusting an initially determined value for the first value based on the difference being initially greater than the threshold error amount; and
recursively repeating adjustment of the first value and execution of the simulation file until the difference is less than the threshold error amount.

15. The method as defined in claim 12 further comprising:
determining based at least partially on component types of the individual components, that a second component of the individual components is a nonlinear component; and
substituting, in the simulation file, for the nonlinear second component, a linearized model of the nonlinear second component.

16. A method comprising:

receiving, by a processor, as inputs to a circuit simulation program executed by the processor, values of individual components of an analog circuit and respective interconnections of the individual components, for creating a simulation file of the analog circuit, wherein the respective interconnections are represented by nodes within the simulation file, wherein a first value of a first component of the individual components is an unknown circuit parameter of the analog circuit;

determining, by the processor, that a number of the components in the simulation file exceeds a threshold number;

partitioning, by the processor, the analog circuit into at least two sub-circuits and analyzing each sub-circuit using a Modified Nodal Analysis Method;

generating, by the processor, a transfer function from the simulation file for one or more nodes of the simulation file;

determining, by the processor, the first value for the first component from the transfer function using a known input/output profile for the analog circuit;

executing, by the processor, the simulation file using the determined first value to simulate operation of the analog circuit for determining a simulated output profile; and based at least partially on determining that a difference between the simulated output profile and the known input/output profile is less than a threshold error amount, outputting, by the processor, a result indicating that the created simulation file has passed validation.

17. The method as defined in claim 16 where the transfer function comprises a Laplace transfer function.

18. The method as defined in claim 16, further comprising adjusting an initially determined value for the first value based on the difference being initially greater than the threshold error amount; and recursively repeating adjustment of the first value and execution of the simulation file until the difference is less than the threshold error amount.

19. The method as defined in claim 16, further comprising converting data from the Modified Nodal Analysis Method to Reduced Modified Nodal Analysis equations for each sub-circuit.

20. The method as defined in claim 19, further comprising applying Hierarchical Middle Block Analysis to the Reduced Modified Nodal Analysis equations.

* * * * *